(12) United States Patent
Raghunathan et al.

(10) Patent No.: US 12,159,910 B2
(45) Date of Patent: Dec. 3, 2024

(54) ISOLATION REGIONS FOR CHARGE COLLECTION AND REMOVAL

(71) Applicant: GlobalFoundries U.S. Inc., Malta, NY (US)

(72) Inventors: Uppili Raghunathan, Essex Junction, VT (US); Vibhor Jain, Essex Junction, VT (US); Sebastian Ventrone, South Burlington, VT (US); Johnatan Kantarovsky, South Burlington, VT (US); Yves Ngu, Williston, VT (US)

(73) Assignee: GlobalFoundries U.S. Inc., Malta, NY (US)

( * ) Notice: Subject to any disclaimer, the term of this patent is extended or adjusted under 35 U.S.C. 154(b) by 388 days.

(21) Appl. No.: 17/671,879

(22) Filed: Feb. 15, 2022

(65) Prior Publication Data
US 2023/0261062 A1    Aug. 17, 2023

(51) Int. Cl.
| H01L 29/40 | (2006.01) |
| H01L 29/06 | (2006.01) |
| H01L 29/423 | (2006.01) |
| H01L 29/735 | (2006.01) |

(52) U.S. Cl.
CPC ........ *H01L 29/407* (2013.01); *H01L 29/0646* (2013.01); *H01L 29/401* (2013.01); *H01L 29/423* (2013.01); *H01L 29/735* (2013.01)

(58) Field of Classification Search
CPC . H01L 29/407; H01L 29/0646; H01L 29/401; H01L 29/423; H01L 29/735; H01L 21/76224; H01L 21/763
See application file for complete search history.

(56) References Cited

U.S. PATENT DOCUMENTS

| 6,559,030 B1 | 5/2003 | Doan et al. |
| 7,253,477 B2 | 8/2007 | Loechelt et al. |
| 9,577,035 B2 | 2/2017 | Hurwitz et al. |
| 9,748,114 B2 | 8/2017 | Cheng et al. |
| 2006/0076629 A1 | 4/2006 | Yilmaz |
| 2016/0163583 A1 | 6/2016 | Liu et al. |
| 2017/0317166 A1* | 11/2017 | Pei ............... H01L 21/76229 |
| 2018/0053765 A1 | 2/2018 | Pendharkar et al. |
| 2018/0061932 A1* | 3/2018 | Kawahara ......... H01L 21/76895 |
| 2021/0233819 A1 | 7/2021 | Shih et al. |

OTHER PUBLICATIONS

Cressler, J.D., "Radiation Effects in SiGe Technology", IEEE Transactions on Nuclear Science, vol. 60, No. 3, pp. 1992-2014 (Jun. 2013).

(Continued)

*Primary Examiner* — Mohammad A Rahman
(74) *Attorney, Agent, or Firm* — Thompson Hine LLP; Francois Pagette

(57) ABSTRACT

Structures with an isolation region and fabrication methods for a structure having an isolation region. The structure includes a semiconductor substrate, a first isolation region surrounding a portion of the semiconductor substrate, a device in the portion of the semiconductor substrate, and a second isolation region surrounding the first isolation region and the portion of the semiconductor substrate.

20 Claims, 6 Drawing Sheets

(56) References Cited

OTHER PUBLICATIONS

Song, Ickhyun et al., "An Investigation of the Use of Inverse-Mode SiGe HBTs as Switching Pairs for SET-Mitigated RF Mixers," IEEE Transactions on Nuclear Science, vol. 63, No. 2, pp. 1099-1108 (Apr. 2016).
European Patent Office, partial European Search Report and Written Opinion issued in European Patent Application No. 22199712.5 on Jul. 14, 2023 (15 pages).
European Patent Office, Extended European Search Report and Written Opinion issued in European Patent Application No. 22199712.5 on Oct. 16, 2023 (13 pages).

* cited by examiner

ISOLATION REGIONS FOR CHARGE COLLECTION AND REMOVAL

BACKGROUND

The disclosure relates to semiconductor device and integrated circuit fabrication and, in particular, to structures with an isolation region and fabrication methods for a structure having an isolation region.

Charge generation caused by a particle, such as a heavy ion, a high energy proton, or a high energy photon, may manifest itself as a single event transient or a single event upset in the electrical terminals of devices and integrated circuits operating under extreme radiation environments. A single event transient may produce a transient voltage glitch. A single event upset may cause a sequential state element to store the wrong state. The transient interaction results in the generation of electron-hole pairs along the track of the transiting particle through ionization processes.

Improved structures with an isolation region and fabrication methods for a structure having an isolation region are needed.

SUMMARY

In an embodiment of the invention, a structure includes a semiconductor substrate, a first isolation region surrounding a portion of the semiconductor substrate, a device in the portion of the semiconductor substrate, and a second isolation region surrounding the first isolation region and the portion of the semiconductor substrate.

In an embodiment of the invention, a structure includes a semiconductor substrate having a first surface and a second surface opposite to the first surface, a first isolation region surrounding a portion of the semiconductor substrate, and a device in the portion of the semiconductor substrate. The first isolation region extends from the first surface into the semiconductor substrate. The structure further includes a second isolation region including a plurality of conductive fingers extending from the second surface into the semiconductor substrate.

In an embodiment of the invention, a method includes forming a first isolation region surrounding a portion of a semiconductor substrate, forming a device in the portion of the semiconductor substrate, and forming a second isolation region surrounding the first isolation region and the portion of the semiconductor substrate.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
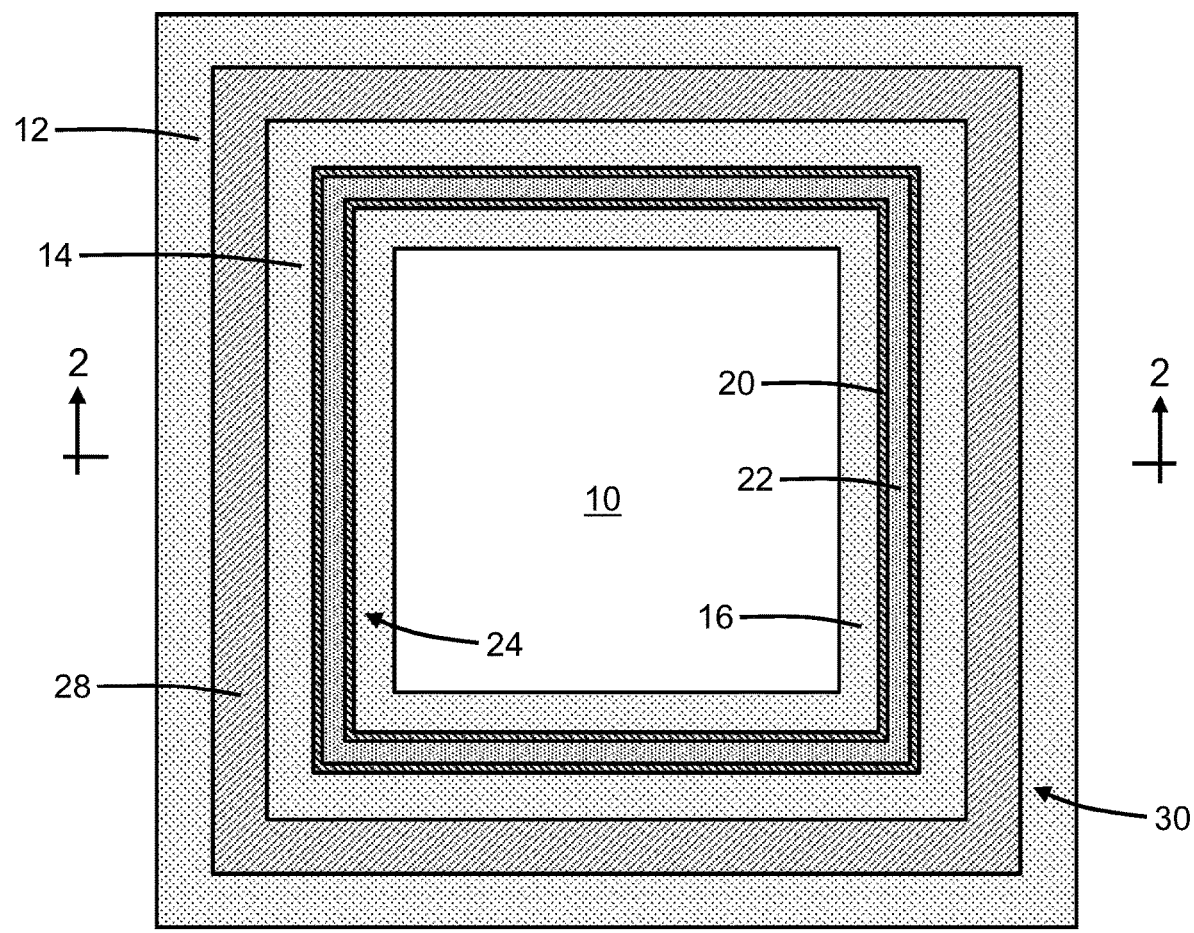
FIG. 1 is a top view of a structure at an initial fabrication stage of a processing method in accordance with embodiments of the invention.
Figure 2:
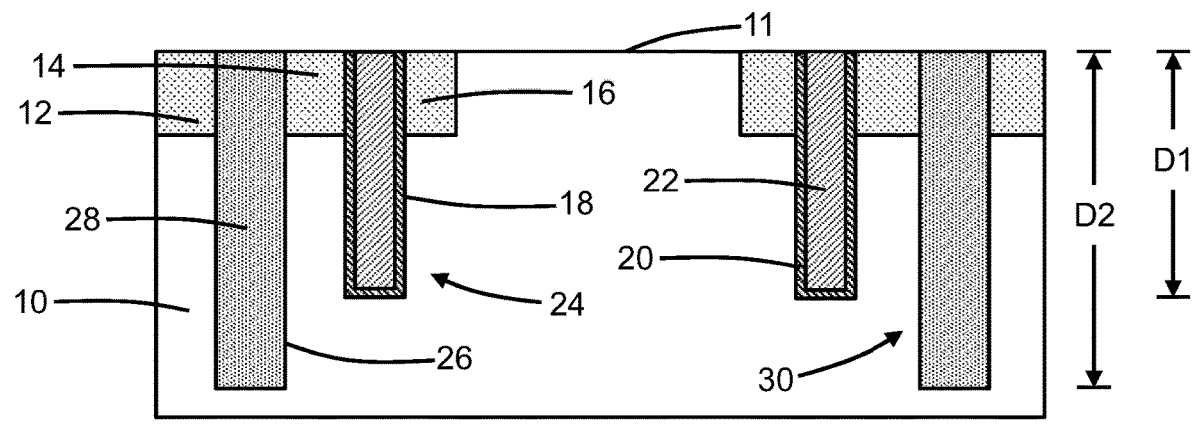
FIG. 2 is a cross-sectional view taken generally along line 2-2 in FIG. 1.

With reference to FIGS. 1, 2 and in accordance with embodiments of the invention, a semiconductor substrate 10 may include shallow trench isolation regions 12, 14, 16 formed by patterning trenches in the semiconductor substrate 10, depositing a dielectric material, such as silicon dioxide, in the trenches, and planarizing with chemical-mechanical polishing. The semiconductor substrate 10 may be, for example, a bulk substrate comprised of semiconductor material, such as single-crystal silicon. In an embodiment, the semiconductor substrate 10 may be lightly doped with a p-type dopant, such as boron, to have p-type conductivity.

A trench 18 is formed as an opening with a sidewall that penetrates into the semiconductor substrate 10 to a bottom at a given depth D1 relative to a front surface 11 of the semiconductor substrate 10. In an embodiment, the depth D1 of the trench 18 may be within a range of about two (2) microns to about six (6) microns. The trench 18 fully surrounds a portion of the semiconductor substrate 10 in which a device is subsequently formed.

The trench 18 may be patterned by lithography and etching processes. To that end, an etch mask may be formed by a lithography process over the semiconductor substrate 10. The etch mask may include a layer of photoresist that is applied by a spin-coating process, pre-baked, exposed to light projected through a photomask, baked after exposure, and developed with a chemical developer to define an opening at the intended location for the subsequently-etched trench 18. An etching process is used to form the trench 18 at the location of the opening in the etch mask, and the etch mask may be stripped by, for example, ashing after the trench 18 is formed.

A dielectric liner 20 is formed on the sidewall and bottom of the trench 18. The dielectric liner 20 may be comprised of a dielectric material, such as silicon dioxide, and the dielectric liner 20 may have a conformal thickness. A conductor layer 22 is formed inside the trench 18 as a core that is interior of the dielectric liner 20. The conductor layer 22 may be comprised of a metal, such as tungsten or copper, that is deposited and planarized by chemical-mechanical polishing. The conductor layer 22 is electrically isolated by the dielectric liner 20 from the semiconductor substrate 10. The dielectric liner 20 and conductor layer 22 that are positioned in the trench 18 collectively define a deep trench isolation region 24.

A trench 26 is formed as an opening with a sidewall that penetrates into the semiconductor substrate 10 to a bottom at a given depth D2 relative to the front surface 11 of the semiconductor substrate 10. In an embodiment, the depth D2 of the trench 26 is greater than the depth D1 of the trench 18. In an embodiment, the depth D2 of the trench 26 may be within a range of about four (4) microns to about ten (10) microns. The trench 26 fully surrounds the deep trench isolation region 24, as well as the portion of the semiconductor substrate 10 surrounded by the deep trench isolation region 24.

The trench 26 may be patterned by lithography and etching processes. To that end, an etch mask may be formed by a lithography process over the semiconductor substrate 10. The etch mask may include a layer of photoresist that is applied by a spin-coating process, pre-baked, exposed to light projected through a photomask, baked after exposure, and developed with a chemical developer to define an opening at the intended location for the subsequently-etched trench 26. An etching process is used to form the trench 26 at the location of the opening in the etch mask, and the etch mask may be stripped by, for example, ashing after the trench 26 is formed.

A conductor layer 28 is formed inside the trench 26. In an embodiment, the conductor layer 28 may be comprised of a doped semiconductor material that is deposited and planarized by chemical-mechanical polishing. In an embodiment, the conductor layer 28 may be comprised of polycrystalline silicon (i.e., polysilicon) doped with an n-type dopant, such as phosphorus and/or arsenic, to provide n-type conductivity. In an embodiment, the conductor layer 28 may be comprised of polycrystalline silicon that is heavily doped (e.g., a dopant concentration greater than or equal to $1 \times 10^{18}$ $cm^{-3}$) with an n-type dopant. In an embodiment, an n-type dopant may be favored over a p-type dopant because of an ability to apply a higher voltage if the conductor layer 28 is biased. In an alternative embodiment, the conductor layer 28 may be comprised of a metal, such as tungsten or copper.

The conductor layer 28 positioned in the trench 26 defines an isolation region 30. In contrast to the deep trench isolation region 24, the isolation region 30 lacks a dielectric liner between the semiconductor substrate 10 surrounding the trench 26 and the conductor layer 28. Instead, the conductor layer 28 is in direct contact with the semiconductor substrate 10 at the sidewall and bottom of the trench 26.

Figure 3:
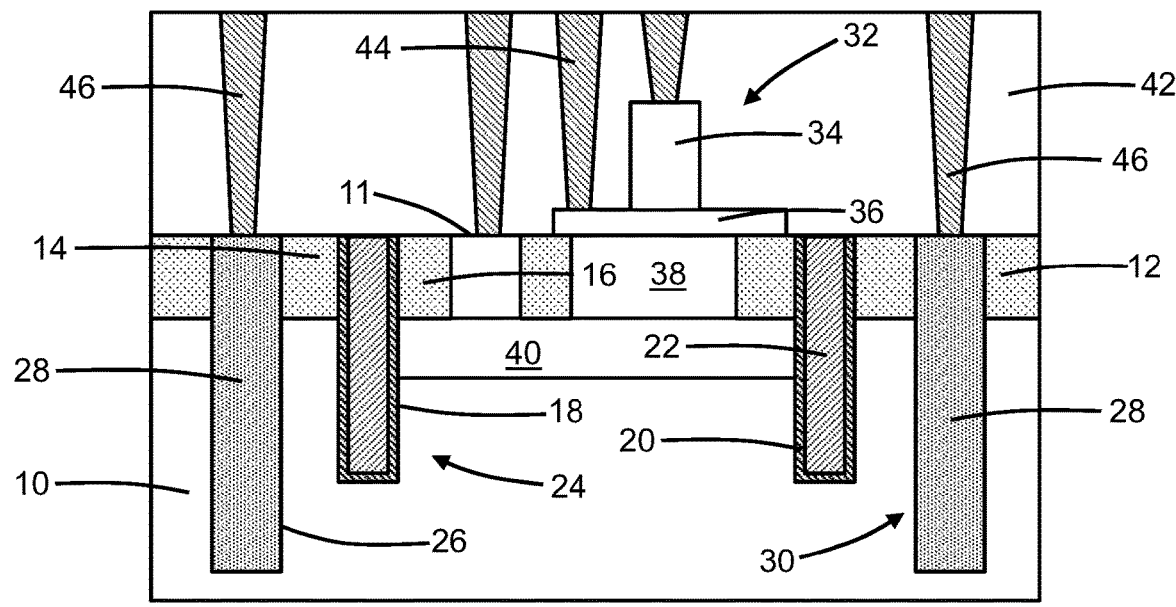
FIG. 3 is a cross-sectional view at a fabrication stage subsequent to FIG. 2.

With reference to FIG. 3 in which like reference numerals refer to like features in FIG. 2 and at a subsequent fabrication stage of the processing method, a device 32 is formed in the portion of the semiconductor substrate 10 that is interior of the deep trench isolation region 24. In an embodiment, the device 32 may be a bipolar junction transistor that includes an emitter 34, a base layer 36, a collector 38, and a subcollector 40. The isolation region 30 may, for example, collect charge generated in the semiconductor substrate 10 by a high-energy particle and divert the charge away from the collector 38 and subcollector 40. In an alternative embodiments, the protected device 32 may be a different type of active device, a passive device, multiple active devices and/or multiple passive devices, or a circuit block.

Middle-of-line processing and back-end-of-line processing follow, which includes formation of contacts, vias, and wiring for an interconnect structure coupled with the device 32. The interconnect structure may include a dielectric layer 42 comprised of a dielectric material, such as silicon dioxide, deposited by chemical vapor deposition and planarized. Contacts 44 are physically and electrically connected to a collector contact region that is coupled by the subcollector 40 with the collector 38, the base layer 36, and the emitter 34. Contacts 46 are physically and electrically connected to the conductor layer 28 of the isolation region 30. The connection to the isolation region 30 is provided at the front surface 11 of the semiconductor substrate 10. Contacts 44, 46 may be formed by patterning contact openings formed in the dielectric layer 42 with a lithography and etching process, followed by filling the contact openings with a conductor, such as tungsten.

The conductor layer 28 of the isolation region 30 may be coupled to a power supply and biased via the contacts 46. In that situation, the conductor layer 28 and the semiconductor substrate 10 of opposite conductivity type may define a reverse-biased p-n junction. Alternatively, the conductor layer 28 of the isolation region 30 may be coupled to ground and thereby grounded via the contacts 46. The deep trench isolation region 24 is not contacted by the contacts 44, 46. The isolation region 30 is also not contacted from the back surface 13 of the semiconductor substrate 10.

The isolation region 30 is capable of mitigating the adverse effects of charge generation in the semiconductor substate 10 caused by a particle, such as a heavy ion or a high energy photon, upon the device 32. As a result, the isolation region 30 may be effective to alleviate the occurrence of a single event transient or a single event upset. The isolation region 30 may collect and remove electron-hole pairs generated along the track of the particle by ionization processes.

Figure 4:
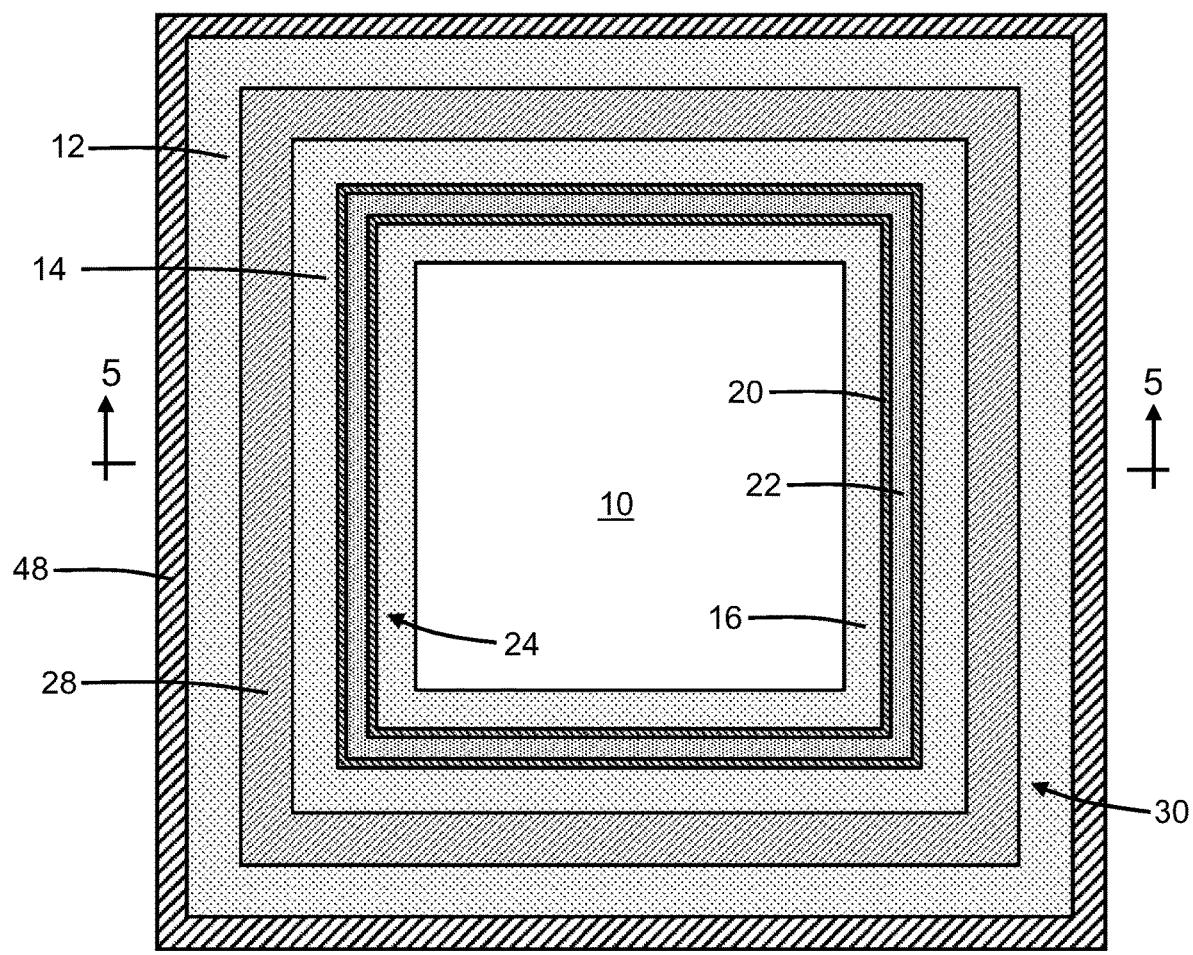
FIG. 4 is a top view of a structure at an initial fabrication stage of a processing method in accordance with alternative embodiments of the invention.
Figure 5:
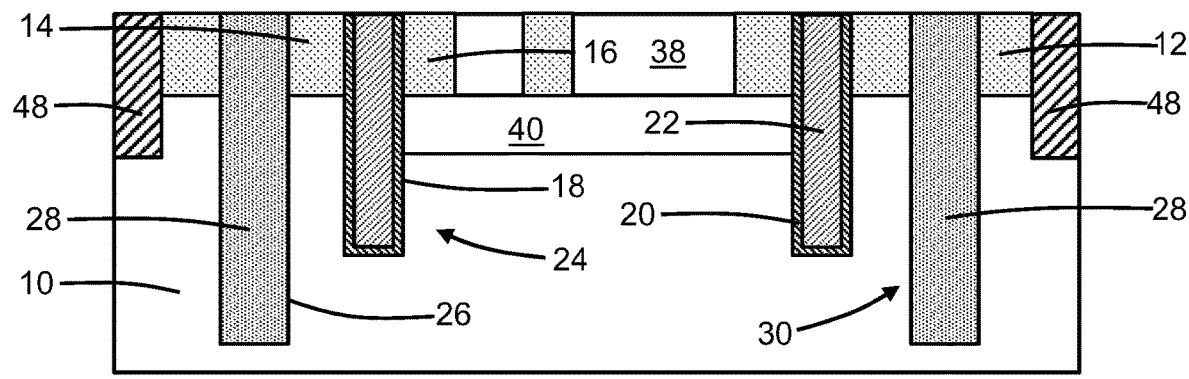
FIG. 5 is a cross-sectional view taken generally along line 5-5 in FIG. 4.

With reference to FIGS. 4, 5 and in accordance with embodiments of the invention, a substrate contact 48 may be added that is connected to the semiconductor substrate 10. In an embodiment, the substrate contact 48 may be a region of the semiconductor substrate 10 that is doped to have the same conductivity type as the semiconductor substrate 10 but at a higher dopant concentration. In an embodiment, the substrate contact 48 may have an opposite conductivity type from the isolation region 30. The substrate contact 48 may be arranged to fully surround the isolation region 30 and the deep trench isolation region 24, as well as surround the portion of the semiconductor substrate 10 that is interior of the deep trench isolation region 24. The shallow trench isolation region 12 laterally separates the substrate contact 48 from the isolation region 30.

Figure 6:
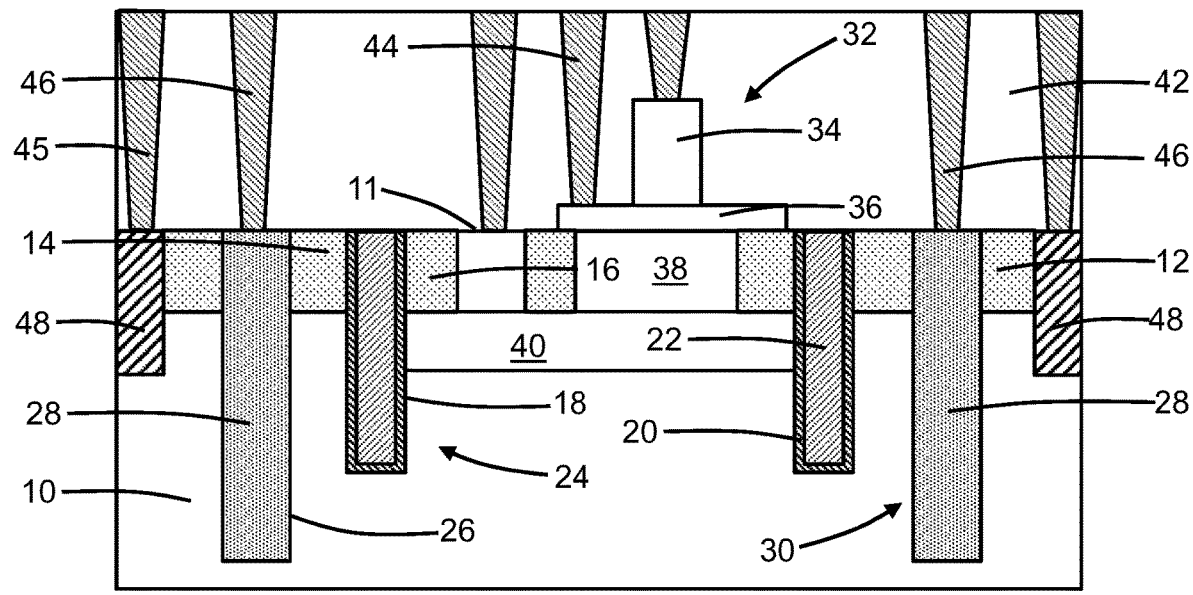
FIG. 6 is a cross-sectional view at a fabrication stage subsequent to FIG. 5.

With reference to FIG. 6 in which like reference numerals refer to like features in FIG. 5 and at a subsequent fabrication stage of the processing method, contacts 45 are formed in the dielectric layer 42 of the interconnect structure. The contacts 45, which are similar to contacts 44, 46, are physically and electrically connected to the substrate contact 48.

Figure 7:
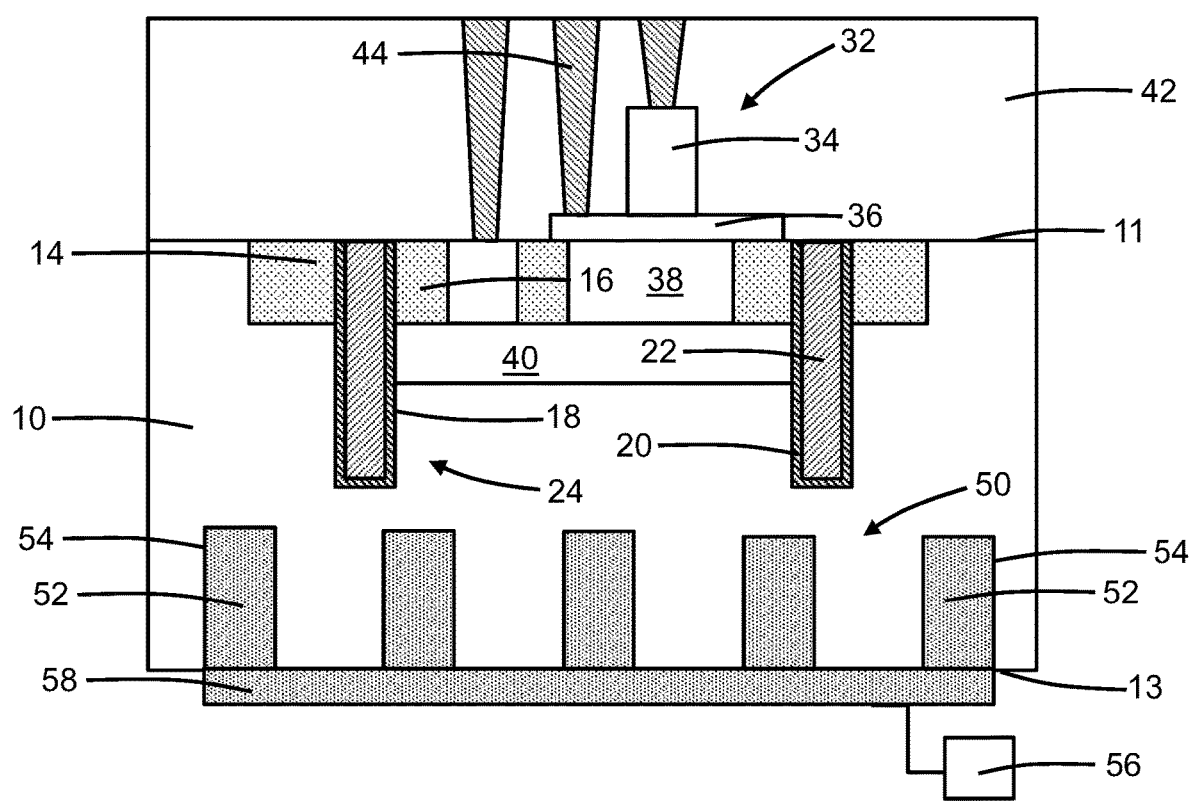
FIG. 7 is a cross-sectional view in accordance with alternative embodiments of the invention.

With reference to FIG. 7 and in accordance with embodiments of the invention, a conductor structure 50 may be formed, instead of the isolation region 30, that similarly provides the ability to collect and remove charge generated by a particle with a trajectory traversing the semiconductor substrate 10 and thereby prevent a single event transient or a single event upset. The conductor structure 50 has a comb-like arrangement with fingers 52 as conductive features that extend from a connector 58 at the back surface 13 into the semiconductor substrate 10. The fingers 52 penetrate only partially from the back surface 13 through the thickness the semiconductor substrate 10 and terminate without penetrating through the front surface 11 that includes the device 32. As a result, the conductor structure 50 is not contacted from the front surface 11 of the semiconductor substrate 10 by a connection in the interconnect structure and otherwise lacks any wire or electrical connections to the interconnect structure on the chip. Instead, the fingers 52 may be connected to ground on a package 56 for the chip including the conductor structure 50.

The fingers 52 may terminate in the semiconductor substrate 10 between the device 32 and the back surface 13. The fingers 52 may be fully positioned in a vertical direction between the deep trench isolation region 24 and the back surface 13. The portion of the semiconductor substrate 10 that includes the device 32 overlaps with at least some of the fingers 52. The fingers 52 extend longitudinally from the back surface 13 and the connector 58 at the back surface 13 toward the front surface 11.

The fingers 52 may be formed in openings 54 extending from the back surface 13 into the semiconductor substrate 10. The openings 54 may be patterned by deep reactive ion etching or laser drilling, and then filled by a conductor to form the fingers 52. In an embodiment, the conductor structure 50 may be comprised of polycrystalline silicon (i.e., polysilicon) doped with an n-type dopant, such as phosphorus and/or arsenic, that provides n-type conductivity. In an embodiment, the conductor structure 50 may be comprised of polycrystalline silicon (i.e., polysilicon) that is heavily doped (e.g., a dopant concentration greater than or equal to $1 \times 10^{18}$ cm$^{-3}$) with an n-type dopant. In an alternative embodiment, the fingers 52 may be comprised of a metal, such as tungsten or copper.

Figure 8:
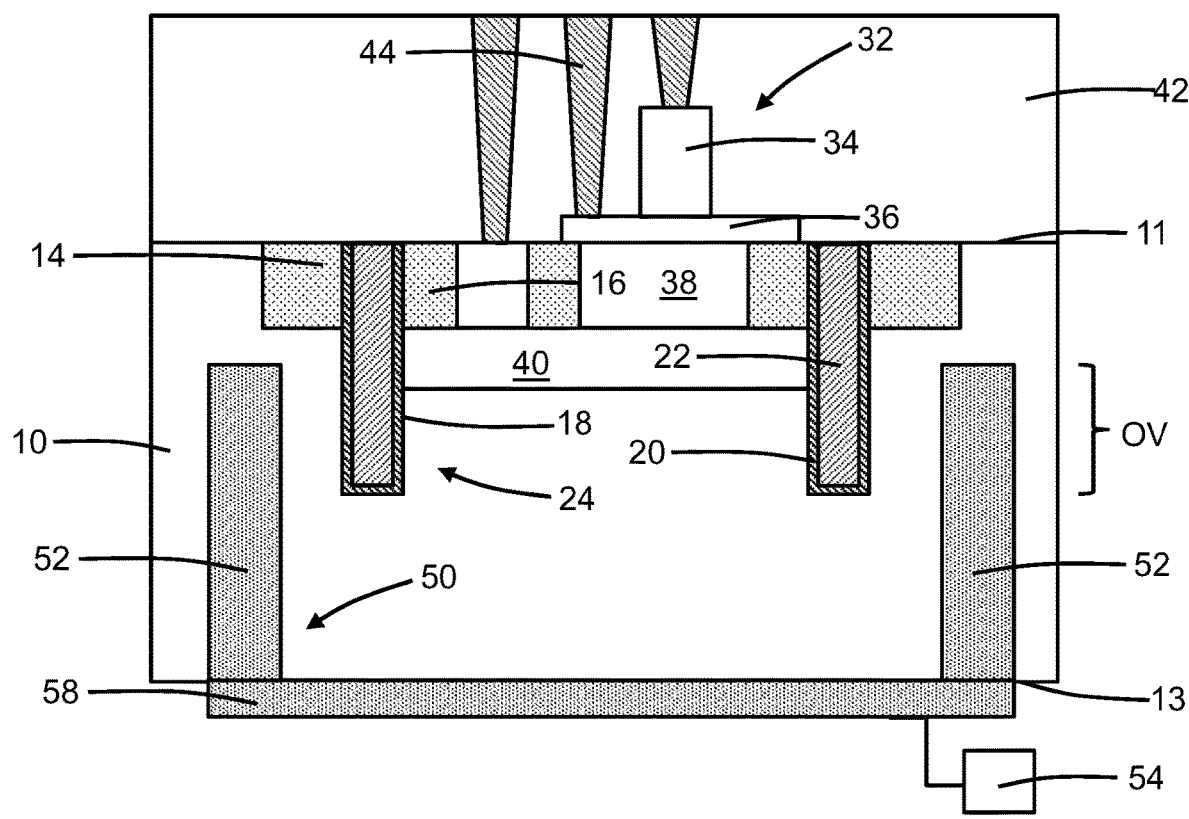
FIG. 8 is a cross-sectional view in accordance with alternative embodiments of the invention.

With reference to FIG. 8 and in accordance with embodiments of the invention, the conductor structure 50 may be adapted to match the size of the device 32. For example, the number of fingers 52 may be reduced if the device 32 is relatively small in size. In an embodiment, the fingers 52 may be located at the periphery of the portion of the semiconductor substrate 10 that includes the device 32, such that the portion of the semiconductor substrate 10 that includes the device 32 have a non-overlapping relationship with the fingers 52. The fingers 52 may have an end portion that is positioned in a vertical direction between the deep trench isolation region 24 and the front surface 11 such that the fingers 52 have an overlap OV in depth with a portion of the deep trench isolation region 24.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate a range of +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features may "overlap" if a feature extends over, and covers a part of, another feature with either direct contact or indirect contact.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
    a semiconductor substrate including a first trench and a second trench;
    a deep trench isolation region including a first conductor layer and a dielectric liner in the first trench in the semiconductor substrate, the deep trench isolation region surrounding a portion of the semiconductor substrate, and the dielectric liner positioned between the first conductor layer and the semiconductor substrate surrounding the first trench;
    a device in the portion of the semiconductor substrate; and
    a charge-collection region including a second conductor layer in the second trench in the semiconductor substrate, the second conductor layer surrounding the deep trench isolation region and the portion of the semiconductor substrate, and the second conductor layer in direct contact with the semiconductor substrate surrounding the second trench.

2. The structure of claim 1 wherein the portion of the semiconductor substrate has a surface, the first trench extends from the surface to a first depth, the second trench extends from the surface to a second depth, and the second depth is greater than the first depth.

3. The structure of claim 2 wherein the first depth is about two microns to about six microns, and the second depth is about four microns to about ten microns.

4. The structure of claim 1 wherein the second conductor layer comprises polycrystalline silicon doped with an n-type dopant.

5. The structure of claim 1 further comprising:
    a dielectric layer on the semiconductor substrate; and
    a contact in the dielectric layer, the contact connected to the second conductor layer.

6. The structure of claim 1 wherein the deep trench isolation region and the charge-collection region each fully surround the portion of the semiconductor substrate.

7. The structure of claim 1 further comprising:
    a shallow trench isolation region surrounding the portion of the semiconductor substrate, the shallow trench isolation region positioned between the deep trench isolation region and the charge-collection region.

8. The structure of claim 1 further comprising:
a substrate contact in the semiconductor substrate, the substrate contact surrounding the deep trench isolation region, the charge-collection region, and the portion of the semiconductor substrate.

9. The structure of claim 1 wherein the second conductor layer comprises a metal.

10. The structure of claim 1 wherein the second conductor layer comprises polycrystalline silicon doped with a p-type dopant.

11. A structure comprising:
a semiconductor substrate having a first surface and a second surface opposite to the first surface;
a deep trench isolation region surrounding a portion of the semiconductor substrate, the deep trench isolation region extending from the first surface into the semiconductor substrate;
a device in the portion of the semiconductor substrate; and
a plurality of conductive fingers extending from the second surface into the semiconductor substrate.

12. The structure of claim 11 wherein the portion of the semiconductor substrate is positioned in a vertical direction between the plurality of conductive fingers and the first surface of the semiconductor substrate.

13. The structure of claim 11 wherein the plurality of conductive fingers overlap in depth with an end portion of the deep trench isolation region.

14. The structure of claim 11 wherein the plurality of conductive fingers penetrate from the second surface partially through the semiconductor substrate and terminate without penetrating through the first surface.

15. The structure of claim 11 wherein the plurality of conductive fingers comprise polycrystalline silicon doped with an n-type dopant.

16. The structure of claim 11 wherein the plurality of conductive fingers comprise polycrystalline silicon doped with a p-type dopant.

17. The structure of claim 11 wherein the plurality of conductive fingers comprise a metal.

18. A method comprising:
forming a first trench and a second trench in a semiconductor substrate;
forming a deep trench isolation region that includes a first conductor layer and a dielectric liner in the first trench, wherein the deep trench isolation region surrounds a portion of the semiconductor substrate, and the dielectric liner is positioned between the first conductor layer and the semiconductor substrate surrounding the first trench;
forming a device in the portion of the semiconductor substrate; and
forming a charge-collection region that includes a second conductor layer in the second trench, wherein the second conductor layer surrounds the deep trench isolation region and the portion of the semiconductor substrate, and the second conductor layer is in direct contact with the semiconductor substrate surrounding the second trench.

19. The method of claim 18 wherein the portion of the semiconductor substrate has a surface, the first trench extends from the surface to a first depth, the second trench extends from the surface to a second depth, and the second depth is greater than the first depth.

20. The method of claim 18 further comprising:
forming a dielectric layer on the semiconductor substrate; and
forming a contact in the dielectric layer that is connected to the second conductor layer.

* * * * *